United States Patent
Minami et al.

(10) Patent No.: US 9,847,301 B2
(45) Date of Patent: Dec. 19, 2017

(54) SEMICONDUCTOR DEVICE

(71) Applicant: TOSHIBA MEMORY CORPORATION, Minato-ku (JP)

(72) Inventors: Toshifumi Minami, Yokohama (JP); Hiroyuki Maeda, Kawasaki (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/448,015

(22) Filed: Mar. 2, 2017

(65) Prior Publication Data
US 2017/0256504 A1 Sep. 7, 2017

(30) Foreign Application Priority Data

Mar. 2, 2016 (JP) ................. 2016-040287

(51) Int. Cl.
| | |
|---|---|
| *H01L 23/544* | (2006.01) |
| *H01L 23/00* | (2006.01) |
| *H01L 23/58* | (2006.01) |
| *H01L 23/528* | (2006.01) |
| *H01L 23/522* | (2006.01) |
| *H01L 21/66* | (2006.01) |
| *H01L 21/78* | (2006.01) |
| *H01L 27/11517* | (2017.01) |

(Continued)

(52) U.S. Cl.
CPC ........ *H01L 23/562* (2013.01); *G01R 31/2644* (2013.01); *H01L 21/78* (2013.01); *H01L 22/12* (2013.01); *H01L 23/528* (2013.01); *H01L 23/5226* (2013.01); *H01L 23/585* (2013.01); *H01L 27/11517* (2013.01); *H01L 27/11563* (2013.01)

(58) Field of Classification Search
CPC . H01L 23/5226; H01L 23/528; H01L 23/585; H01L 23/544; H01L 27/11517; H01L 27/11563
See application file for complete search history.

(56) References Cited

U.S. PATENT DOCUMENTS 7,161,231 B2 * 1/2007 Koike ................... H01L 23/544
257/620
2005/0212147 A1 9/2005 Nishizawa
(Continued)

FOREIGN PATENT DOCUMENTS

| JP | 7-193108 A | 7/1995 |
|---|---|---|
| JP | 2005-277338 A | 10/2005 |

(Continued)

*Primary Examiner* — Trung Q Dang
(74) *Attorney, Agent, or Firm* — Oblon, McClelland, Maier & Neustadt, L.L.P.

(57) ABSTRACT

According to one embodiment, a semiconductor device includes a semiconductor substrate including an element region, a guard ring provided on an outer periphery of the element region and including a first interconnect and a first plug which electrically couples the first-interconnect and a first well region, a second interconnect provided above the first interconnect via a first insulating layer and non-electrically coupling to the first interconnect, and a first circuit coupled to the second interconnect. The first circuit detects one of a crack and a peeling of the guard ring in accordance with a break in the second interconnect or a short circuit between the second interconnect and the first interconnect.

15 Claims, 7 Drawing Sheets

(51) Int. Cl.
*H01L 27/11563* (2017.01)
*G01R 31/26* (2014.01)

(56) References Cited

U.S. PATENT DOCUMENTS

| 2006/0102980 | A1* | 5/2006 | Nakashiba | H01L 21/823878 |
| | | | | 257/508 |
| 2009/0174011 | A1* | 7/2009 | Jeon | H01L 23/585 |
| | | | | 257/409 |
| 2014/0264767 | A1* | 9/2014 | Gratz | H01L 21/78 |
| | | | | 257/620 |

FOREIGN PATENT DOCUMENTS

| JP | 2008-16573 A | 1/2008 |
| JP | 2013-74113 A | 4/2013 |

* cited by examiner

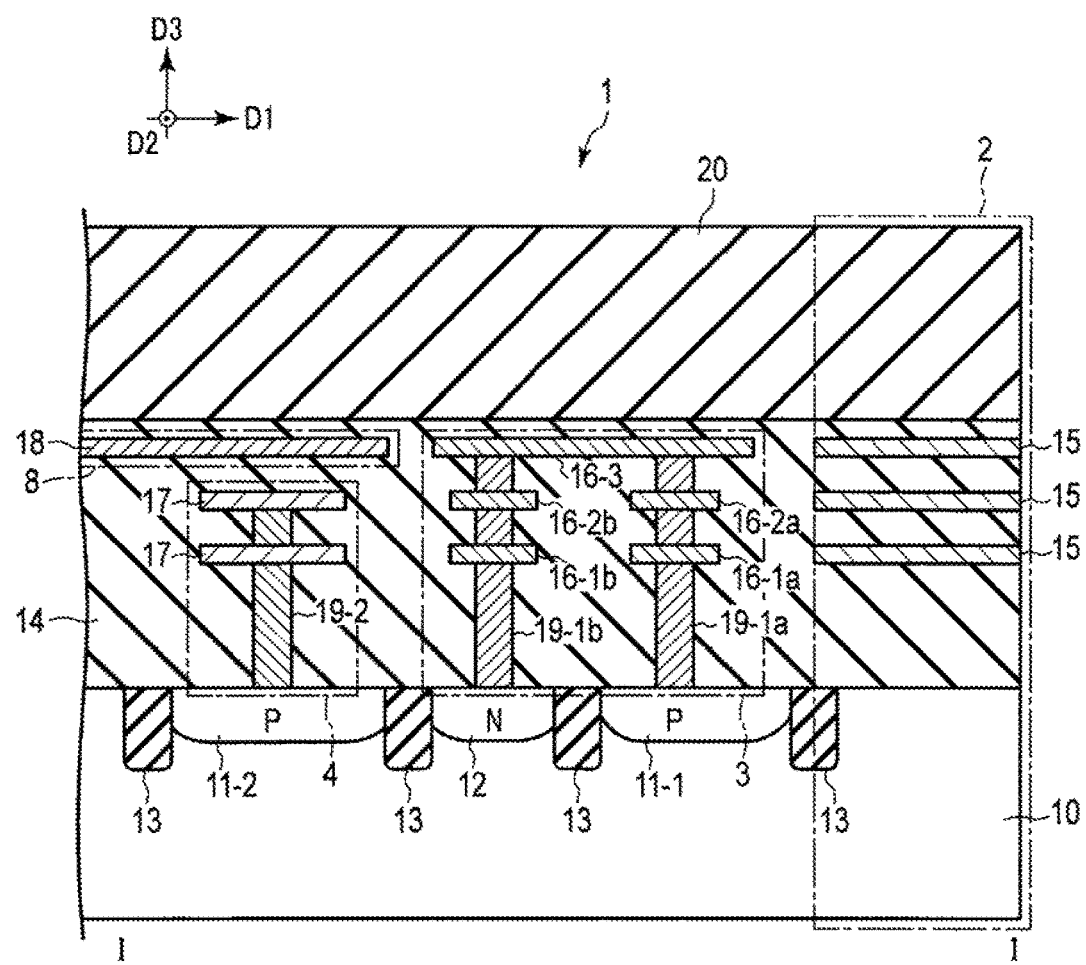
F I G. 2

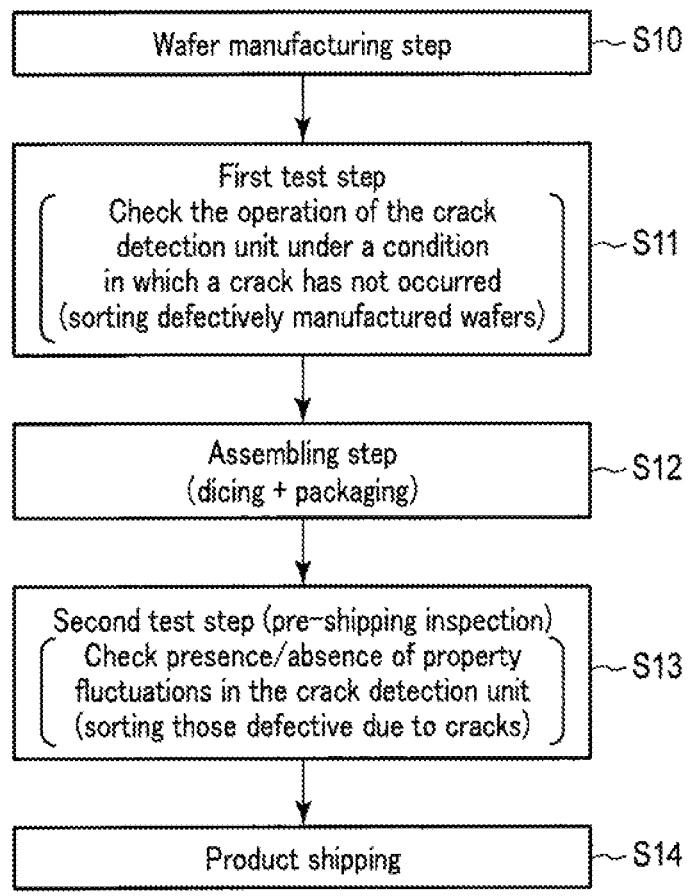
F I G. 4

SEMICONDUCTOR DEVICE

CROSS-REFERENCE TO RELATED APPLICATIONS

This application is based upon and claims the benefit of priority from Japanese Patent Application No. 2016-040287, filed Mar. 2, 2016, the entire contents of which are incorporated herein by reference.

FIELD

Embodiments described herein relate generally to a semiconductor device.

BACKGROUND

As a semiconductor memory device, a NAND flash memory is known in the art.

BRIEF DESCRIPTION OF THE DRAWINGS

FIG. 2 is a sectional view taken along line I-I shown in FIG. 1;

FIG. 4 is a flowchart illustrating an example of a manufacturing process in the semiconductor device according to the first embodiment;

DETAILED DESCRIPTION

In general, according to one embodiment, a semiconductor device includes a semiconductor substrate including an element region having a semiconductor element, a guard ring to which a ground voltage is applied and which is provided on an outer periphery of the element region and includes a first interconnect and a first plug electrically coupling the first interconnect and a first well region, a second interconnect provided above the first interconnect via a first insulating layer and non-electrically coupling to the first interconnect, and a first circuit coupled to the second interconnect. The first circuit detects one of a crack and a peeling of the guard ring in accordance with a break of the second interconnect or a short circuit between the second interconnect and the first interconnect.

1. First Embodiment

A semiconductor device according to the first embodiment will be described. In the descriptions below, a NAND flash memory will be described as an example of the semiconductor device.

1.1 Configuration 1.1.1 Configuration of Semiconductor Device

First, the configuration of the semiconductor device will be described with reference to FIG. 1.

Figure 1:
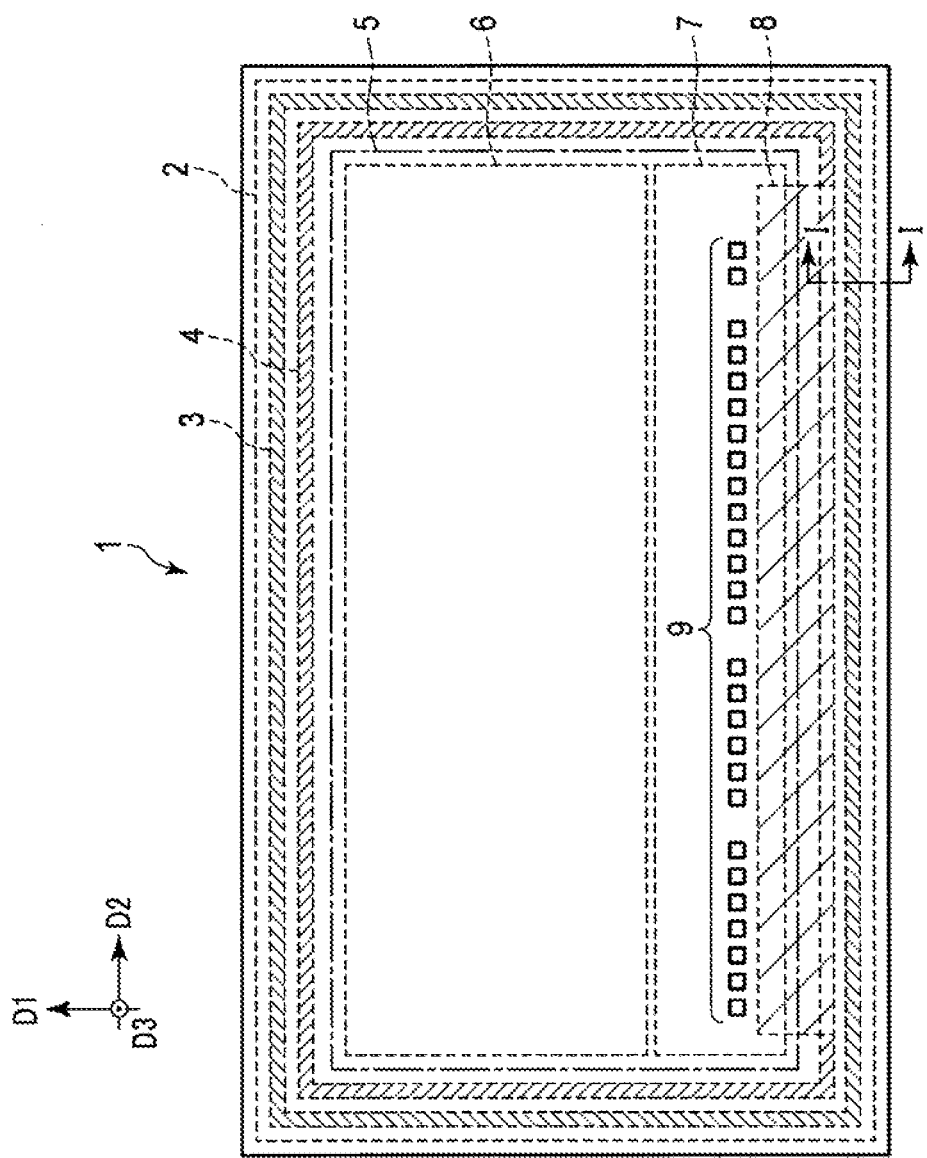
FIG. 1 is a top view of a semiconductor device according to the first embodiment.

As shown in FIG. 1, the NAND flash memory 1 comprises a scribe region 2, a crack stopper 3, a guard ring 4, an element region 5, a crack detection unit 8, and electrode pads 9.

The scribe region 2 is a region to be cut off by a blade of a dicer when a plurality of semiconductor devices formed on a wafer are cut into chips during a dicing process. The scribe region 2 is provided so as to surround the edge of the NAND flash memory 1, i.e., the outermost periphery of the semiconductor chip. In the description below, the direction toward the edge of the semiconductor device is defined as an outer side, and the direction toward the center of the semiconductor device is defined as an inner side.

The crack stopper 3 is provided in the inner side of the scribe region 2 so as to surround the guard ring 4 and the crack detection unit 8. The crack stopper 3 suppresses a crack or a peeling from reaching to the inner side of the semiconductor device, i.e., the element region 5 when a crack or a peeling of an inter-layer insulating film, etc. occurs at the edge of the semiconductor device. The crack stopper 3 suppresses water or metal ion, etc. from penetration into the element region 5 from the edge of the semiconductor device through the crack or the peeling. For this reason, a metal material may be used for the crack stopper 3. The crack stopper 3 suppresses a surge from entering from the outside in the dicing process or the packaging process, and suppresses a flow of an overcurrent in an interconnect layer of the guard ring 4. Note that one crack stopper 3 preferably surrounds the outer periphery of the guard ring 4 and the crack detection unit 8; however, the crack stopper 3 may be divided into multiple parts.

The guard ring 4 is provided to surround the element region 5. The guard ring 4 retains the outer periphery of the semiconductor device at the same potential (a ground voltage VSS) to stabilize the potential of power supply lines, wells, etc. The guard ring 4 suppresses impurities carrying a charge from entering from silicon exposed at the edge of the semiconductor device, for example. In the example of FIG. 1, one guard ring 4 surrounds the outer periphery of the element region 5; however, the guard ring 4 may be divided into multiple parts.

The element region 5 is a region in which various semiconductor elements constituting the NAND flash memory 1 are formed, and includes a memory 6 and a peripheral circuit 7. The memory 6 includes a plurality of memory cells for storing data, etc. that are input from external devices in a non-volatile manner, for example. The peripheral circuit 7 includes, for example, a controller which controls read and write of data in accordance with instructions from external devices, a voltage generator which generates voltages necessary in the NAND flash memory 1, a logic circuit which processes commands, etc. that are input from the external device, and an input-output circuit which communicates data, etc. with external devices, and so on.

The crack detection unit 8 includes a crack detector and a crack detection line. In the present embodiment, a circuit provided in the peripheral circuit 7 (e.g., a controller, a voltage generator, a logic circuit, or an input-output circuit, etc.) is also used as a crack detector. In other words, any one of the circuits included in the NAND flash memory 1 doubles as a crack detector, instead of newly providing a circuit dedicated for crack detection. A part of an interconnect of the crack detector (any one of the circuits provided in the peripheral circuit 7), or an interconnect which is coupled to the crack detector (e.g., a power supply voltage line), is used as a crack detection line. In this case, since the crack detection line detects a short circuit between the crack detection line and the guard ring 4 to which a voltage VSS is applied, the crack detection line to which a voltage other than the voltage VSS (e.g., a power supply voltage VCC) is applied is desirable. A part of the crack detection line is arranged on the guard ring 4 with an insulating layer interposed therebetween so that the the crack detection line is not electrically coupled to the guard ring 4. The crack detection unit 8 detects a crack and a peeling which occurs in the guard ring 4 and in proximity thereof when the crack detection line has a break or when the crack detector fails to operate normally due to a short circuit between the crack detector and the guard ring 4 (or the crack stopper 3).

A plurality of the crack detection units 8 may be provided along the guard ring 4. Furthermore, if a poor memory cell is caused by a crack or a peeling, the memory 6 can recover using other memory cells; thus, the crack detection unit 8 does not have to be provided at the outer periphery of the memory 6. Furthermore, the crack detection unit 8 may include a crack detector and a crack detection line dedicated for crack detection. Furthermore, a part of the crack detector may be formed on the guard ring 4 with an insulating layer being interposed therebetween so that the crack detector is not electrically coupled to the guard ring 4.

A plurality of the electrode pads 9 are electrically coupled to external devices. The NAND flash memory 1 inputs and outputs data and various signals to and from external devices, and takes in power supply voltages supplied from external devices. The plurality of electrode pads 9 can be arranged as appropriate, and may be provided above the memory 6.

1.1.2 Cross-sectional Configuration of Semiconductor Device

Next, the cross-sectional configuration of the semiconductor device, particularly the region on the outer side of the element region 5, will be described with reference to FIG. 2. FIG. 2 is a sectional view taken along line I-I shown in FIG. 1. The example of FIG. 2 shows a case where three layers of interconnect layers are provided.

As shown in FIG. 2, the scribe region 2, the crack stopper 3, the guard ring 4, and a part of the crack detection unit 8 (the crack detection line) are provided on the outer periphery of the element region 5. A p-type well 11 (11-1 and 11-2) and an n-type well 12 are provided in the proximity of the surface of the p-type semiconductor substrate 10, and they are separated from each other by element isolation regions 13. An insulating layer 14 is formed on the semiconductor substrate 10, and on the upper part of the insulating layer, three layers of the interconnect layers and three layers of insulating layers 14 are alternately formed, for example. The insulating layers 14 are formed using a silicon oxide film, for example. A protection layer 20 is provided so as to coat the upper surface of the uppermost insulating layer 14. The protection layer 20 is formed using polyimide or a silicon nitride film, etc., for example.

First, the scribe region 2 is described. In the scribe region 2, i.e., the edge of the NAND flash memory 1, four layers of the insulating layers 14 and three layers of the interconnect layers 15 are alternately formed on the semiconductor substrate 10. The interconnect layer 15 is a dummy pattern to suppress occurrence of a crack and a peeling during dicing, for example, or a test line for use at the time of manufacturing a semiconductor device, or an alignment pattern at the time of lithography. The interconnect layer 15 does not have to be electrically coupled to the semiconductor elements of the element region 5. Furthermore, the plurality of the interconnect layers 15 may be coupled to each other by a contact plug (not shown). Furthermore, the interconnect layers 15 may be omitted.

Next, the crack stopper 3 is described. In the example of FIG. 2, in the proximity of the surface of the semiconductor substrate 10, the p-type well 11-1 and the n-type well 12 are provided side by side, along the first direction D1, from the outer side of the semiconductor, with the device separation region 13 therebetween. For example, the p-type well 11-1 and the n-type well 12 are so provided as to surround the guard ring 4 when viewed from the above. The interconnect layers 16-1*a*, 16-2*a*, and 16-3 are so provided, from the bottom to the upper layers above the p-type well 11-1 as to surround the guard ring 4, for example, with the insulating layer 14 being interposed therebetween. The interconnect layers 16-1*a*, 16-2*a*, and 16-3 are coupled to the p-type well 11-1 by the contact interconnect layer 19-1*a* which is formed in the shape of a line to surround the guard ring 4, for example. Similarly, the interconnect layers 16-1*b*, 16-2*b*, and 16-3 are so provided, from the bottom to the upper layers above the n-type well 12 as to surround the guard ring 4, for example, with the insulating layer 14 being interposed therebetween. The interconnect layers 16-1*b*, 16-2*b*, and 16-3 are coupled to the n-type well 12 by the contact interconnect layer 19-1*b* which is formed in the shape of a line to surround the guard ring for example. Accordingly, the p-type well 11-1 and the n-type well 12 are coupled to each other via the interconnect layer 16-3.

Note that the crack, stopper preferably has a structure of coupling the uppermost interconnect layer with the p-type well or the n-type well to separate the element region 5 from the scribe region 2. If the crack stopper 3 has a structure of coupling the uppermost interconnect layer with the p-type well or the n-type well, the layout of the well, the interconnect layers, and the contact interconnect layers are changeable as appropriate. For example, the contact interconnect layers 19-1*a* and 19-1*b* and the interconnect layers 16-1*a*, 16-1*b*, 16-2*a*, 16-2*b*, and 16-3 may be arranged in such a manner that each of the layers surrounds the outer periphery of the guard ring 4, or in such a manner that the layers are separated into multiple interconnects. Similarly, the p-type well 11-1 and the n-type well 12 may also be separated into a plurality of well regions. For example, a single interconnect layer may be formed instead of the interconnect layers 16-1*a* and 16-1*b* on the same layer, or the interconnect layers 16-2*a* and 16-2*b* on the same layer, like the interconnect layer 16-3. Furthermore, a contact plug may be formed instead of the contact interconnect layer 19-1. Furthermore, one, or three or more contact interconnect layers 19-1 may be formed.

Next, the guard ring 4 is described. In the proximity of the surface of the semiconductor substrate 10, a p-type well 11-2 is provided to surround the element region 5, when viewed from the top surface. Two layers of the interconnect layers 17 are provided on the p-type well 11-2 with the insulating layer 14 being interposed therebetween. Two layers of the interconnect layers 17 are coupled to the p-type well 11-2 by the contact interconnect layer 19-2 which is formed in the shape of a line so as to surround the element region 5, for example. Since a function of the guard ring 4 is different from that of the crack stopper 3, the guard ring 4 may not have a structure of coupling the uppermost interconnect layer with the p-type well. The layout of the p-type well 11-2, the interconnect layers 17, and the contact interconnect layer 19-2 in the guard ring 4 can be changed as appropriate. For example, the interconnect layer 17 and the contact interconnect layer 19-2 may be arranged in such a manner that each of the interconnects surrounds the outer periphery of the element region 5, or in such a manner that the layers may be separated into multiple interconnects. The same is true of the p-type well 11-2. Furthermore, a contact plug may be formed instead of the contact interconnect layer 19-2. Two or more contact interconnect layers 19-2 may be formed.

The crack detection unit 8 includes an interconnect layer 18 which functions as a crack detection line. The interconnect layer 18 is provided on the two interconnect layers 17 of the guard ring 4 with the insulating layer 14 being interposed therebetween. In other words, the uppermost interconnect layer provided on the guard ring 4 is used as a crack detection line. The interconnect layer 18 and the interconnect layers 17 are not electrically coupled. The interconnect layer 18 is coupled to the crack detector in the element region 5 which is not shown. A plurality of the interconnect layers 18 may be provided above the interconnect layers 17 of the guard ring 4. Furthermore, the interconnect layer 18 does not have to be provided on the uppermost layer but may be provided, along the third direction D3, on an interconnect layer different from the interconnect layers 17 of the guard ring 4. For example, if three Interconnect layers are provided above the semiconductor substrate, the interconnect layer at the second layer from the bottom layer may be the interconnect layer 18, or the second layer and the uppermost layer may be the interconnect layer 18.

1.2 Specific Example of Crack Detection Unit

Next, a specific example of the crack, detection unit 8 will be described with reference to FIG. 3. The example shown in FIG. 3 illustrates a case where an input-output circuit is used as the crack detector and the interconnect which couples the voltage generator and the crack detector (the input-output circuit) is arranged on the guard ring 4 as a crack detection line GMONI.

Figure 3:
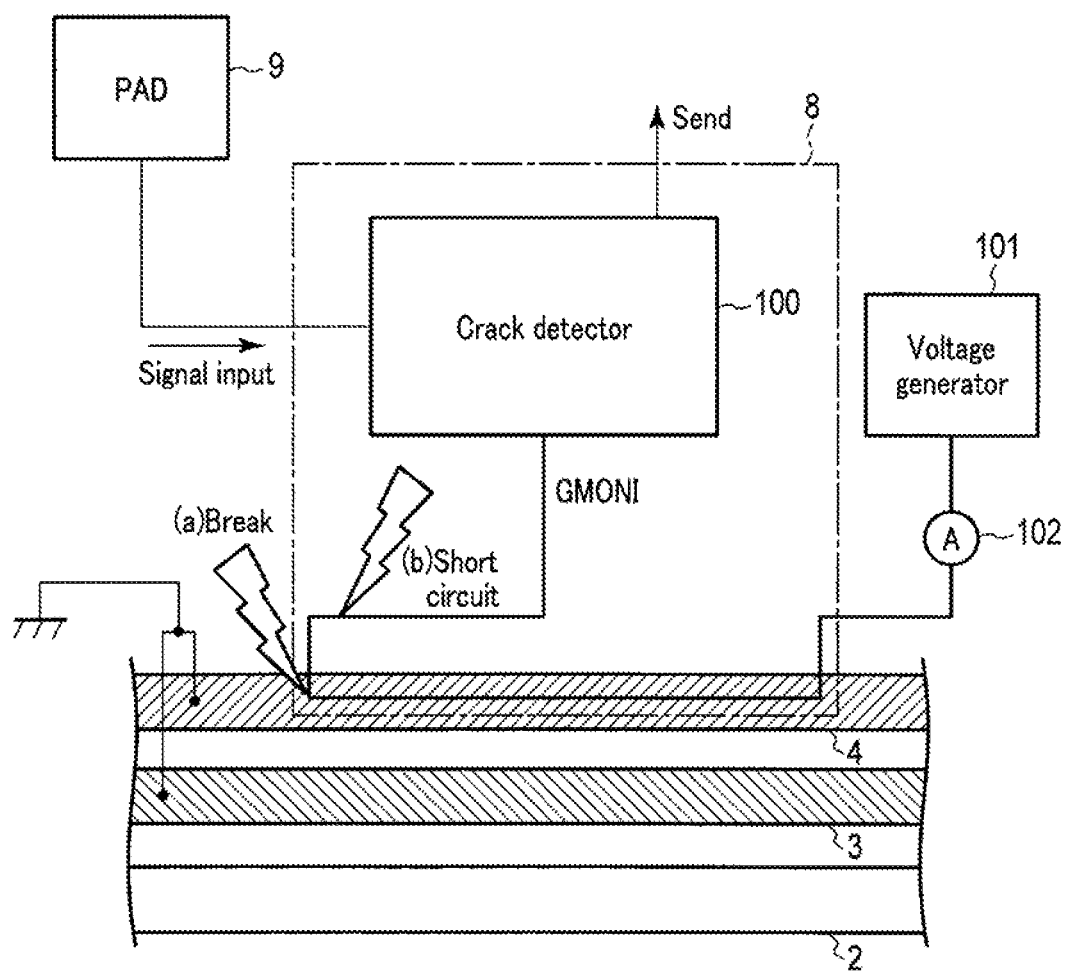
FIG. 3 is a drawing illustrating an example of crack detection in the semiconductor device according to the first embodiment.

As shown in FIG. 3, the crack detection unit 8 in the present example includes a crack detector 100 and a crack detection line GMONI coupled to the crack detector.

The crack detection line GMONI is coupled to the voltage generator 101 via an ammeter 102 provided in the peripheral circuit 7. The voltage generator 101 applies a necessary voltage to the crack detector 100 via the crack detection line GMONI. The ammeter 102 monitors a quantity of current flowing from the voltage generator 101 to the crack detector 100 via the crack detection line GMONI.

The crack detector 100 (e.g., an input-output circuit) sends a detection result based on a signal which is input from external devices via the electrode pads 9 and a voltage supplied from the voltage generator 101. More specifically, the crack detector 100 sends an input signal to a logic circuit or a controller, for example. At this time, the crack detector 100 normally operates as an input-output circuit as long as a voltage applied from the voltage generator 101 falls within a predetermined range. On the other hand, if the voltage applied from the voltage generator 101 falls out of the predetermined range because of a crack or a peeling, the crack detector 100 fails to operate normally as an input-output circuit and transmits an error signal, or fails to operate and does not transmit a signal. In other words, if the crack detector 100 is in a state of malfunctioning, it can be said that the crack detector 100 is in a state of detecting a crack or a peeling.

In the above configuration, if a crack or a peeling occurs, the guard ring 4 and the crack detection line GMONI are short-circuited ((a) in FIG. 3), or the crack detection line GMONI has a break ((b) in FIG. 3).

If a short circuit occurs, for example, a current flows from the crack detection line GMONI to the semiconductor substrate 10 via the guard ring 4. As a result, the voltage generator 101 cannot apply a sufficient voltage to the crack detector 100. For this reason, the crack detector 100 fails to operate normally. Furthermore, a current larger than a predetermined upper limit flows in the crack detection line GMONI. The controller, for example, determines, from an error signal sent from the crack detector 100 (a signal indicating that a crack or a peeling is detected) and a result of the current monitoring at the ammeter 102 (current flows in the crack detection line GMONI>the predetermined upper limit), that a crack or a peeling has occurred in the guard ring 4 and that the crack detection line GMONI is short-circuited.

If a break occurs, for example, almost no current flows in the crack detection line GMONI. In other words, a current which flows in the crack detection line GMONI smaller than a predetermined lower limit flows. Thus, the voltage generator 101 cannot apply a sufficient voltage to the crack detector 100. The controller, for example, determines, from an error signal sent from the crack detector 100 (a signal indicating that a crack or a peeling is detected) and a result of the current monitoring at the ammeter 102 (current flows in the crack detection line GMONI<predetermined lower limit), that a crack or a peeling has occurred and the crack detection line GMONI has a break.

In the example shown in FIG. 3, a case where a part of the interconnect of the voltage generator 101 is arranged on the guard ring 4 with the insulating layer 14 being interposed therebetween is explained; however, a part of the interconnect of the crack detector 100 may be arranged on the guard ring 4 with the insulating layer 14 being interposed therebetween.

1.3 Specific Example of Crack Detection Test

Next, a specific example of the crack detection test using the crack detector of the present embodiment will be described with reference to FIG. 4. The example of FIG. 4 shows using a crack detection test as one of the test items in a sorting test of shipment products. In the following, explanations of test items other than the crack detection test will be omitted.

As shown in FIG. 4, each manufacturing step for a semiconductor device is performed in a wafer state (step S10).

Next, when the manufacturing steps are finished, a first test step to sort defectively manufactured products is performed (step S11). In the first test step, a crack detection test is performed in a state where dicing has not been performed (a crack or a peeling has not occurred). More specifically, a voltage and a current applied to the crack detector is monitored, for example, to determine whether the voltage and the current falls within a predetermined range. Furthermore, a signal, which is processed by the crack detector, is monitored, for example, to determine whether a normal value is output or not. By this manner, defectively manufactured products (initially defective) related to the crack detection unit are sorted.

Next, an assembling step including dicing and packaging is performed (step S12).

Next, a second test step (a pre-shipping test) is performed after assembling (step S13). In the second test step, the same crack detection test as that in the first test step is performed, and a measurement result of the first test step and a measurement result of the second test step are compared. If a crack or a peeling occurs in the assembling step, the fluctuation of electrical properties in the second test step becomes large. As a result, it is regarded that a short circuit or a break has occurred due to a crack or a peeling, and the semiconductor device is determined to be a defective product.

At the end, products that have passed the pre-shipping test are shipped (step S14).

In the present example, a case where a crack detection test is used to sort pre-shipping products is explained; however, the application of the crack detection test is not limited thereto. The crack detection test may be applied as one of the evaluation items in a reliability test for products, such as an operation test under high humidity and high temperature and a thermal cycling test, etc. The crack detection test may be applied as one of the items in an operation test performed after a semiconductor device is installed on an electronic device.

1.4 Advantageous Effects of Present Embodiment

The effects according to the present embodiment will be described.

If a crack or a peeling occurs in an element region of the semiconductor device in the dicing process, a short circuit or a break is caused in an interconnect, and a defect occurs in a product. To suppress a crack or a peeling, besides a conventional blade method using a hard cutter, a thermal separation method using high-energy irradiation is possible to adopt in the dicing process. It should be noted, however, that the cost of the thermal separation method is higher than the cost of the conventional blade method. Since heat generated by the thermal separation method affects a semiconductor device, if is necessary to take a sufficient distance between a cutting surface and the semiconductor device (to broaden a width of a scribe region), and therefore, there is a problem that the semiconductor device including a scribe region cannot be downsized.

Furthermore, as a method of determination defective products due to a crack or a peeling, the visual inspection method after the dicing step is generally adopted. It should be noted, however, it is difficult to perfectly identify a micro crack or a peeling, etc. by the visual inspection method; as a result, the processes are managed to excessively strict specifications so that a product is determined as being a defective product even if the product has a crack or a peeling that does not reach inside the crack stopper, and product yield is degraded. Furthermore, a crack or a peeling may reach to the element region due to stress from a package; however, it is difficult to apply the visual inspection method after packaging. Unless products in which a crack occurs after packaging are sorted, a defective product mixture rate for shipped products may increase.

As a method of electrically determining a crack or a peeling, there is a method of monitoring a break in the interconnect by providing an interconnect on the outer periphery of the semiconductor device, with the ends of the interconnect coupled to different electrode pads, for example. However, an interconnect region dedicated for crack detection or electrode pads are required; thus, the chip surface area of the semiconductor device tends to increase. Electrode pads (pins) used for such a test are sometimes not electrically coupled when a semiconductor device is installed on a print substrate, etc.; thus, monitoring cannot be performed after products are shipped.

In contrast, in the configuration according to the present embodiment, an existing circuit in a semiconductor device (a constituent circuit of a semiconductor device) may double as a crack detector. A part of the interconnect resident in or coupled to the crack detector is arranged on the guard ring as a crack detection line, with an insulating layer being interposed therebetween. When a break occurs in a crack detection line, or when a crack detection line is short-circuited with a guard ring, a crack detector malfunctions and the output properties will change. Thus, the crack detector can detect a crack or a peeling which occurs in the guard ring or in the proximity thereof. As a result, only a product in which a crack or a peeling occurs inside of a crack stopper (a product with problems in its properties) can be determined as a defective product, and it is possible to suppress degradation of product yield due to excessively strict specifications. Furthermore, since a crack or a peeling which occurs after packaging can also be detected, a defective product mixture rate in shipped products can be reduced. Thus, the reliability of the semiconductor device can be improved.

Furthermore, according to the present embodiment, an existing circuit in the semiconductor device is used as a crack detector. Accordingly, even when the semiconductor device is installed into an electronic device, a crack or a peeling can be detected.

Furthermore, according to the present embodiment, since an existing circuit in the semiconductor device is used as a crack detector, and the crack detection line is arranged on the guard ring with the insulating layer being interposed therebetween, it is possible to suppress an increase of a chip size of the semiconductor device.

2. Second Embodiment

Next, the second embodiment will be described. A difference from the first embodiment is a crack detection line arranged beneath the electrode pads. In the following, only the matters different from the first embodiment will be explained.

2.1 Configuration of Semiconductor Device

First, the configuration of the semiconductor device will be described with reference to FIG. 5.

Figure 5:
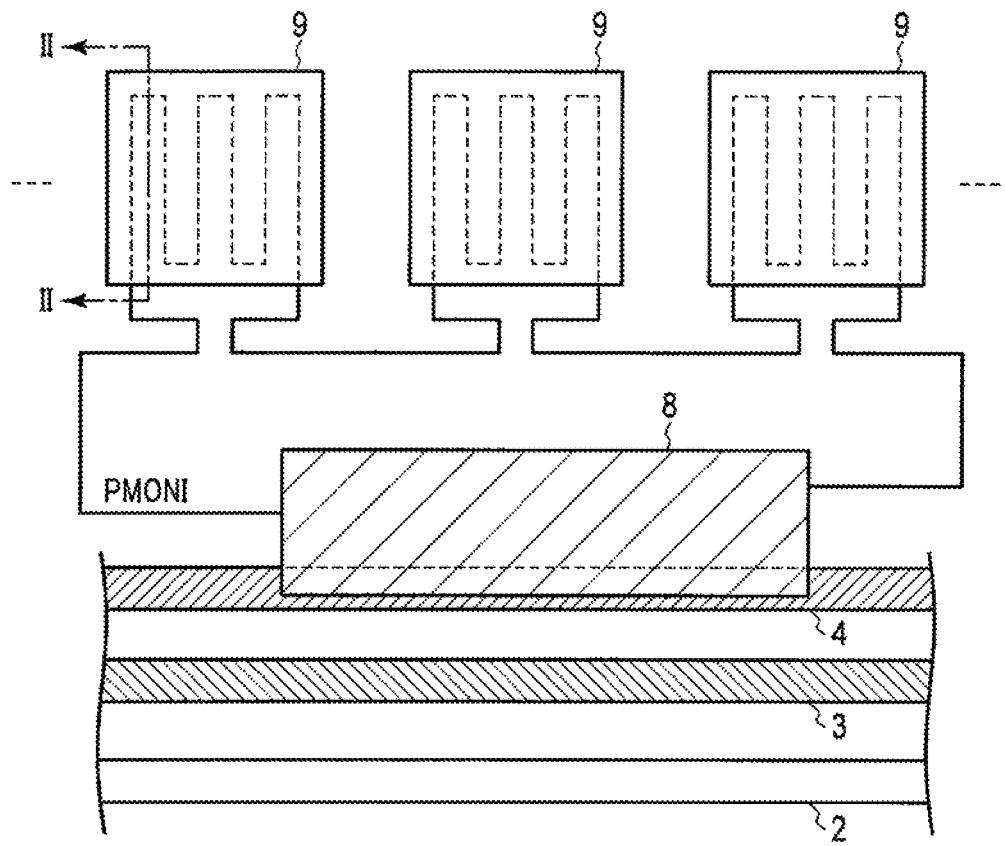
FIG. 5 is a layout diagram of electrode pads and a crack detection unit of the semiconductor memory device according to the second embodiment.

As shown in FIG. 5, the crack detection unit 8 includes a crack detection line PMONI for the electrode pad 9.

For the crack detection line PMONI, an interconnect of the crack detector, or an interconnect which is coupled to the crack detector (e.g., a power supply voltage line) is used. The crack detection line PMONI is preferably an interconnect different from the crack detection line GMONI to distinguish a crack or a peeling from a crack or a peeling that occurs in the guard ring, and is further preferably an interconnect to which a voltage other than the voltage VSS (e.g., the power supply voltage VCC) is applied to detect a short circuit with the electrode pad. A part of the crack detection line PMONI is arranged beneath the electrode pad 9 with an insulating layer interposed therebetween so as to not be electrically coupled to the electrode pad 9. The crack detection unit 8 detects a crack and a peeling which occurs in or beneath the electrode pad 9 when a part of the crack detection line PMONI has a break, or when the crack detection unit 8 is short-circuited with the electrode pad 9. The example of FIG. 5 shows a case where one crack detection line PMONI is arranged beneath three electrode pads 9 with an insulating layer being interposed therebetween; however, the number of the electrode pads 9 corresponding to one crack detection line PMONI can be determined as appropriate. For example, one crack detection line PMONI may be arranged for one electrode pad 9. In this case, the electrode pad 9 in which a crack occurs can be distinguished on a unit-by-unit basis.

2.2 Cross-sectional Configuration of Semiconductor Device

Figure 6:
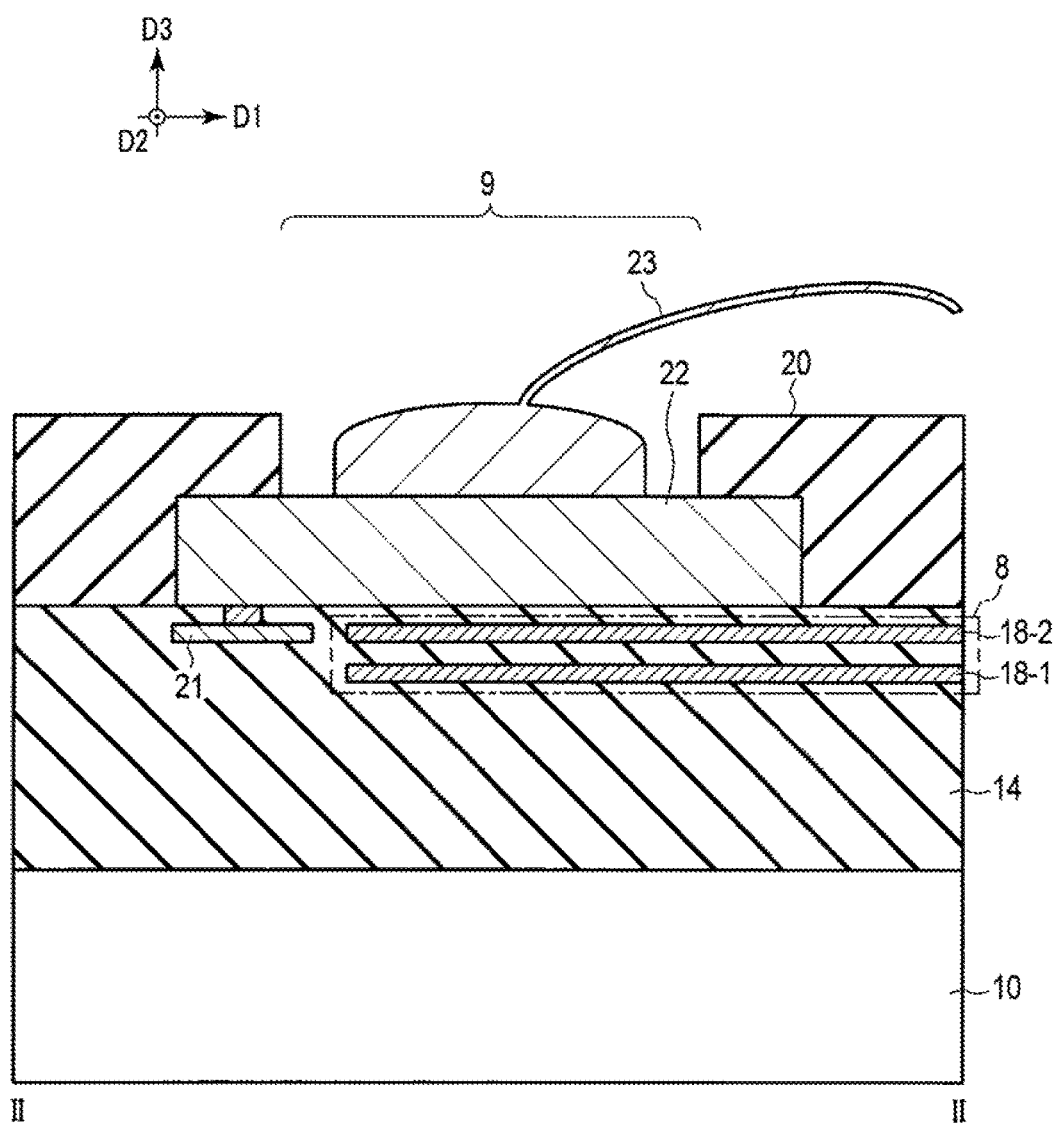
FIG. 6 is a sectional view taken along line II-II shown in FIG. 5.

Next, the cross-sectional configuration of the semiconductor device, particularly the cross-sectional configuration in the electrode pad will be described with reference to FIG. 6. FIG. 6 is a sectional view taken along line II-II shown in FIG. 5.

As shown in FIG. 6, the insulating layer 14 is formed on the semiconductor substrate 10, and the interconnect layer 18-1, the insulating layer 14, and the interconnect layer 18-2 are formed thereon, one by one. The interconnect layers 18-1 and 18-2 are coupled to a crack detector as the crack detection line PMONI. Furthermore, an interconnect layer 21 is provided on the same layer as the interconnect layer 18-2. The interconnect layer 21 is coupled to the input-output circuit, for example. The interconnect layer 18-2 and the interconnect layer 21 correspond to an uppermost interconnect layer. The insulating layer 14 are provided on the interconnect layers 18-1 and 18-2, and an electrode pad metal layer 22 is provided thereon. The interconnect layer 21 and the electrode pad metal layer 22 are electrically coupled by a contact plug. The interconnect layers 18-1 and 18-2 are not electrically coupled to the interconnect layer 21 and the electrode pad 9. The electrode pad metal layer 22 is coated by the protection layer 20, but the protection layer 20 is partially removed on the top surface of the electrode pad metal layer 22, and the electrode pad 9 is formed. A bonding wire (e.g., a metal wire) 23 is crimped on the top surface of the electrode pad 9 to couple the electrode pad 9 to external devices. The interconnect layer 18-1 may be omitted, and only the uppermost interconnect layer 18-2 may be provided.

2.3 Specific Example of Crack Detection Unit

Next, a specific example of the crack detection unit 8 will be described with reference to FIG. 7. A difference from the example shown in FIG. 3 according to the first embodiment is an addition of the crack detection line PMONI coupled to the crack detector 100.

As shown in FIG. 1, a part of the interconnect coupled to a circuit (e.g., an inverter, a register, etc.) in the crack detector 100 is arranged beneath the electrode pad 9 as a crack detection line PMONI, with an insulating layer being interposed therebetween so as not to be electrically coupled to the electrode pad 9.

Figure 7:
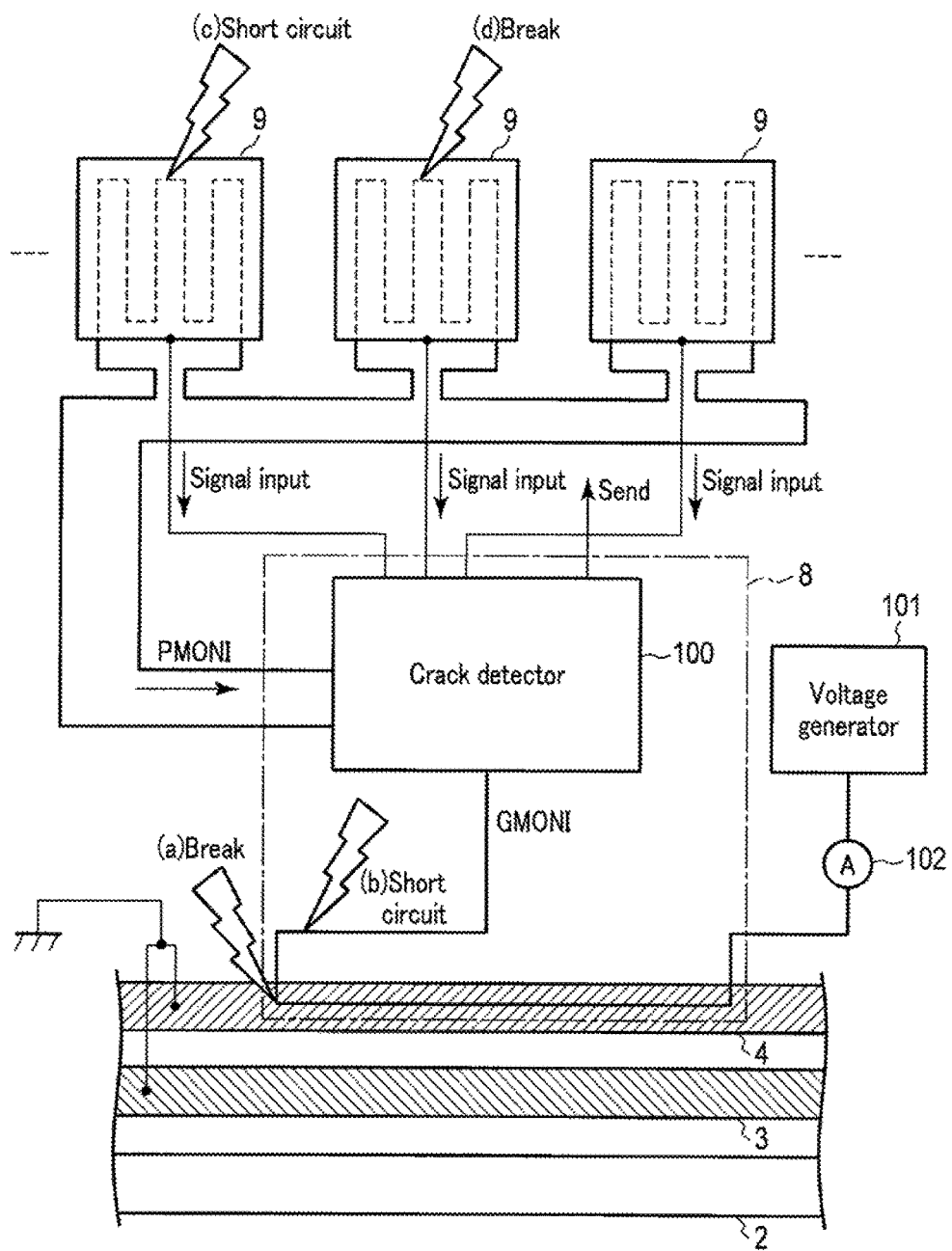
FIG. 7 is a drawing illustrating an example of the crack detection in the semiconductor device; according to the second embodiment.

For example, in the step of bonding, if a crack or a peeling occurs beneath the electrode pad 9, and the electrode pad 9 is short-circuited with the crack detection line PMONI ((c) in FIG. 7), a voltage is input to the crack detector 100 from the short-circuited electrode pad 9 in accordance with the crack detection line PMONI, as a voltage is applied to the crack detection line PMONI. As a result, in the crack detector 100, only an input signal corresponding to the short-circuited electrode pad 9 indicates an abnormal value. In other words, the crack detector 100 sends an error signal of the corresponding electrode pad 9 (a crack detection signal). The controller, for example, determines that, depending on a result of a signal sent from the crack detector 100, a crack or a peeling occurs in the electrode pad 9 corresponding to the input signal indicating an abnormal value, and that a short circuit occurs.

If the crack detection line PMONI has a break ((d) in FIG. 7), a circuit corresponding to the crack detection line PMONI stops operating normally in the crack detector 100. In other words, the crack detector 100 sends an error signal due to the malfunction of the circuit (a crack detection signal). In this case, the controller determines that a crack or a peeling occurs in the electrode pad 9.

2.4 Advantageous Effects of Present Embodiment

The configuration according to the present embodiment can produce the same effect as the first embodiment.

Furthermore, in the present embodiment, a crack or a peeling which occurs in and beneath the electrode pad can be detected. This effect will be explained below.

A crack or a peeling may occur in an electrode pad when pressing a test prober in the test step, or when connecting to, for example, a gold wire in the bonding step. However, if a crack or a peeling occurs beneath an electrode pad, it is difficult to determine the crack or the peeling by the visual inspection method because the electrode pad is located on the top surface. For this reason, if the electrical properties are normal, a semiconductor device may be determined to be a non-defective product, and may be shipped. However, if a crack or a peeling has occurred in the semiconductor device, the crack or the peeling may develop because of an influence of the circumstances of the actual usage of an electronic device in which the semiconductor device is installed (the influence of the stress applied to the semiconductor substrate), and a defect may emerge after installing the semiconductor device in the electronic device. Thus, there is a possibility that a defective product mixture rate in the shipped products may increase, or that long-term reliability may be affected.

In contrast, in the configuration according to the present embodiment, a crack detection line is arranged beneath the electrode pad. If the crack detection line has a break or is short-circuited with an electrode pad, the output properties of the crack detector will change, thereby detecting a crack or a peeling that has occurred beneath the electrode pad. Thus, it is possible to reduce a defective product mixture rate in the shipped product, and the reliability of the semiconductor device can be improved.

3. Examples of Modifications, etc.

The semiconductor device according to the above embodiments includes a semiconductor substrate including an element region (5 in FIG. 1) having a semiconductor element, a guard ring (4 in FIG. 1) to which a ground voltage (VSS) is applied and which is provided on an outer periphery of the element region and includes a first interconnect (17 in FIG. 2) and a first plug (19-2 in FIG. 2) electrically coupling the first interconnect and a first well region (11-2 in FIG. 2), a second interconnect (18 in FIG. 2, GMONI in FIG. 3) provided above the first interconnect via a first insulating layer and non-electrically coupling to the first interconnect, and a first circuit (100 in FIG. 3) coupled to the second interconnect. The first circuit detects one of a crack and a peeling of the guard ring in accordance with a break in the second interconnect or a short circuit between the second interconnect and the first interconnect.

By applying the above embodiments, it is possible to provide a semiconductor device that can improve reliability. Note that, the embodiments are not limited to the above-explained aspects, and different variations are possible.

The above-described embodiments, for example, are not limited to a NAND flash memory; it can be applied to a semiconductor storage device using other storage devices. Furthermore, the above-described embodiments can be applied not only to a semiconductor storage device but to a semiconductor device in which interconnect layers are stacked.

Furthermore, the term "connect" or "couple" in the above embodiments includes an indirect connection with an element, for example a transistor or a resistor, etc., being interposed.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor device comprising:
a semiconductor substrate including an element region having a semiconductor element;
a guard ring provided on an outer periphery of the element region and including a first interconnect and a first plug which electrically couples the first interconnect and a first well region, a ground voltage being applied to the guard ring;
a second interconnect provided above the first interconnect via a first insulating layer and non-electrically coupling to the first interconnect; and
a first circuit coupled to the second interconnect,
wherein the first circuit detects one of a crack and a peeling of the guard ring in accordance with a break in the second interconnect or a short circuit between the second interconnect and the first interconnect.

2. The device according to claim 1, further comprising:
a third interconnect coupled to the first circuit; and
an electrode pad provided above the third interconnect via a second insulating layer and non-electrically coupling to the third interconnect,
wherein the first circuit detects one of a crack and a peeling of the electrode pad in accordance with a break of the third interconnect or a short circuit between the third interconnect and the electrode pad.

3. The device according to claim 1, further comprising a crack stopper provided on an outer periphery of the guard ring and including a fourth interconnect and a second plug which electrically couples the fourth interconnect and a second well region.

4. The device according to claim 1, further comprising an ammeter configured to measure a first current flowing in the second interconnect.

5. The device according to claim 1, wherein
a first voltage different from the ground voltage is applied to the second interconnect when the one of the crack and the peeling of the guard ring is detected in the first circuit.

6. The device according to claim 2, wherein
a first voltage different from the ground voltage is applied to the third interconnect when the one of the crack and the peeling in the electrode pad is detected in the first circuit.

7. The device according to claim 1, wherein
the first circuit is one of an input-output circuit, a logic circuit, a voltage generator, and a controller.

8. The device according to claim 1, wherein
if the second interconnect and the first interconnect are short-circuited, a first current higher than a second current flows in the second interconnect, and
if the second interconnect has the break, a fourth current lower than a third current which is lower than the second current flows in the second interconnect.

9. The device according to claim 2, wherein
the first circuit and the electrode pad are coupled by a fifth interconnect different from the third Interconnect, and
if the third interconnect and the electrode pad are short-circuited, a first voltage applied to the third interconnect is input to the first circuit via the fifth interconnect.

10. The device according to claim 1, wherein
the guard ring surrounds the outer periphery of the element region.

11. The device according to claim 1, wherein
the crack stopper surrounds an outer periphery of the guard ring.

12. The device according to claim 1, comprising a NAND flash memory.

13. The device according to claim 1, wherein
the first interconnect surrounds the outer periphery of the element region.

14. The device according to claim 1, wherein
the first plug has a shape of a line and surrounds the outer periphery of the element region.

15. The device according to claim 1, wherein
the first circuit is provided in the element region.

* * * * *